US011343948B2

(12) United States Patent
Onishi et al.

(10) Patent No.: US 11,343,948 B2
(45) Date of Patent: May 24, 2022

(54) MOUNTING DEVICE AND MOUNTING METHOD

(71) Applicant: FUJI CORPORATION, Chiryu (JP)

(72) Inventors: Michinaga Onishi, Chiryu (JP); Jun Iisaka, Nisshin (JP); Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/968,412

(22) PCT Filed: Mar. 13, 2018

(86) PCT No.: PCT/JP2018/009753
§ 371 (c)(1),
(2) Date: Aug. 7, 2020

(87) PCT Pub. No.: WO2019/175968
PCT Pub. Date: Sep. 19, 2019

(65) Prior Publication Data
US 2020/0404817 A1 Dec. 24, 2020

(51) Int. Cl.
*H05K 3/30* (2006.01)
*H05K 13/04* (2006.01)
(Continued)

(52) U.S. Cl.
CPC ..... *H05K 13/0408* (2013.01); *H05K 13/0069* (2013.01); *H05K 13/0812* (2018.08)

(58) Field of Classification Search
CPC ............. H05K 13/0408; H05K 13/041; H05K 13/0413; H05K 13/0812; H05K 13/0813
See application file for complete search history.

(56) References Cited

U.S. PATENT DOCUMENTS 4,621,407 A * 11/1986 Suzuki ............... B23Q 1/015
29/26 A
6,457,232 B1 10/2002 Isogai et al.
(Continued)

FOREIGN PATENT DOCUMENTS

JP 11-307998 A 11/1999
JP 2001-136000 A 5/2001
(Continued)

OTHER PUBLICATIONS

International Search Report dated May 1, 2018 in PCT/JP2018/009753 filed on Mar. 13, 2018, citing documents AQ and AR therein, 2 pages.

*Primary Examiner* — Paul D Kim
(74) *Attorney, Agent, or Firm* — Oblon, McClelland, Maier & Neustadt, L.L.P.

(57) ABSTRACT

A mounting device for executing a mounting process of mounting a component on a board includes: a mounting head that includes at least one pickup section for picking up the component and moves the picked up component; a storage section configured to store at least a first correction value determined at a first position on XYZ axes on which the mounting head works and a second correction value determined at a second position different from the first position; and a control section configured to execute the mounting process by using the first correction value and/or the second correction value stored in the storage section.

7 Claims, 6 Drawing Sheets

(51) Int. Cl.
*H05K 13/08* (2006.01)
*H05K 13/00* (2006.01)

(56) References Cited

U.S. PATENT DOCUMENTS

| | | | |
|---|---|---|---|
| 10,440,868 B2 * | 10/2019 | Iwasaki | H05K 13/0409 |
| 10,653,051 B2 * | 5/2020 | Ikeda | H05K 13/04 |
| 10,716,250 B2 * | 7/2020 | Fujishiro | H05K 13/082 |
| 2010/0220183 A1 * | 9/2010 | Yoro | H01L 21/67144 |
| | | | 348/86 |
| 2013/0120554 A1 * | 5/2013 | Suzuki | H05K 13/0812 |
| | | | 348/87 |
| 2015/0305213 A1 | 10/2015 | Itoh et al. | |
| 2018/0199478 A1 | 7/2018 | Yamazaki et al. | |
| 2019/0116699 A1 * | 4/2019 | Ito | H05K 13/0813 |

FOREIGN PATENT DOCUMENTS

| | | |
|---|---|---|
| JP | 2017-92273 A | 5/2017 |
| JP | 2017-112249 A | 6/2017 |
| WO | WO 2012/144282 A1 | 10/2012 |
| WO | WO 2017/006461 A1 | 1/2017 |

\* cited by examiner

MOUNTING DEVICE AND MOUNTING METHOD

TECHNICAL FIELD

The present specification discloses a mounting device and a mounting method.

BACKGROUND ART

In the conventional art, a mounting device is propose, for example, such that it measures the positional coordinates of marks on a jig board with multiple marks, mounts a dummy component on the jig board, measures the positional coordinate of the mounted dummy component, calculates the amount of error between the positional coordinates, and performs a mounting process in which the amount of error is corrected (for example, see Patent Literature 1). In this device, sufficient mounting accuracy can be ensured even in a high-speed operation. Further, a device, which forms multiple detection marks on a glass board, mounts an inspection chip on the glass board, and detects the mounting accuracy from the positional relationship between the detection mark and the inspection chip, is proposed (for example, see Patent Literature 2). In this mounting device, a jig that can more easily and accurately detect the mounting accuracy can be provided.

PATENT LITERATURE

Patent Literature 1: JP-A-11-307998
Patent Literature 2: JP-A-2001-136000

BRIEF SUMMARY

Technical Problem

By the way, in recent years, the mounting device has handled finer components, and it is desired to further improve the mounting accuracy. Further, in order to improve accuracy and reduce a processing time of the mounting process, various configurations are added to a mounting member configured to execute the mounting process, and in the above-described mounting device disclosed in Patent Literatures 1 and 2, a case occurs in which sufficient mounting accuracy cannot be ensured.

The present disclosure has been made in view of such problems, and a main purpose of the present disclosure is to provide a mounting device and a mounting method which can further improve the mounting accuracy.

Solution to Problem

The mounting device and the mounting method disclosed in the present specification have adopted the following means in order to achieve the above-described main purpose.

A mounting device, which is disclosed in the present specification for executing a mounting process of mounting a component on a board, includes: a mounting head that includes at least one pickup section for picking up the component and moves the picked up component; a storage section configured to store at least a first correction value determined at a first position on XYZ axes on which the mounting head works and a second correction value determined at a second position different from the first position; and a control section configured to execute the mounting process by using the first correction value and/or the second correction value stored in the storage section.

In the mounting device, a correction value is set for each different position where the mounting head works, and the mounting process is performed using the correction value suitable for each position. In this mounting device, the mounting accuracy can be further improved using multiple correction values. The storage section stores the first correction value at the first position and the second correction value at the second position, but may further include correction values such as a third correction value at a third position and a fourth correction value at a fourth position.

DESCRIPTION OF EMBODIMENTS

Figure 1:
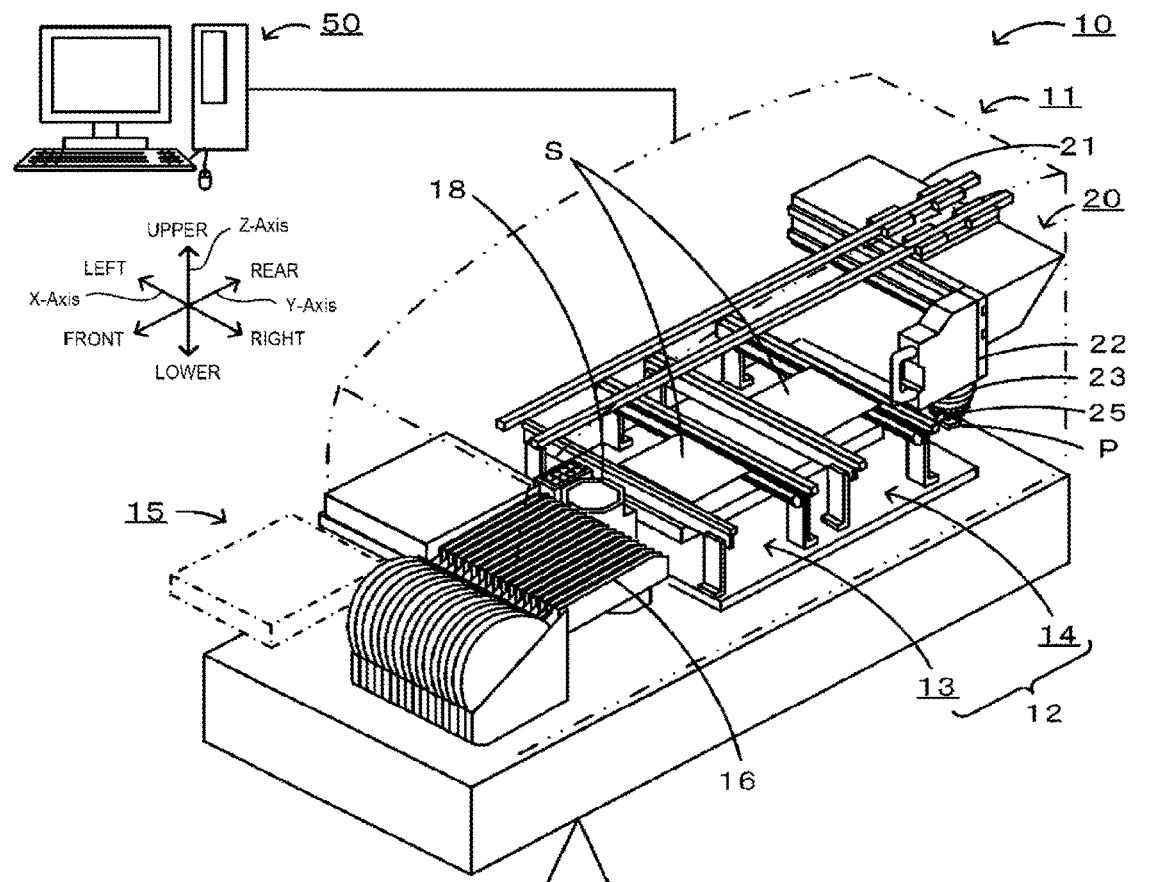
FIG. 1 is a schematic explanatory view illustrating an example of mounting system 10.
Figure 1:
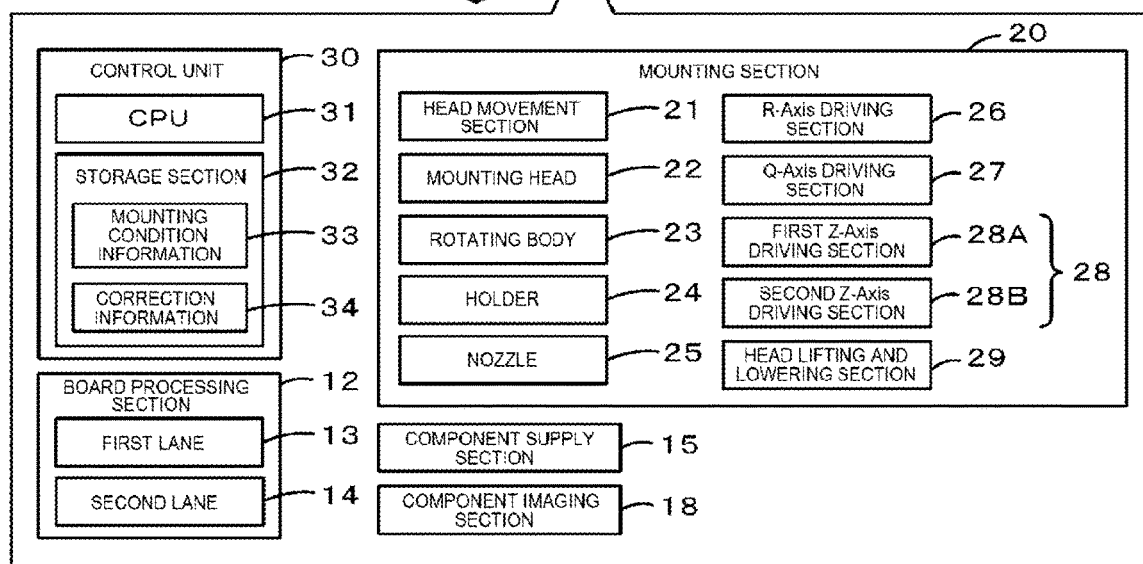
Figure 2:
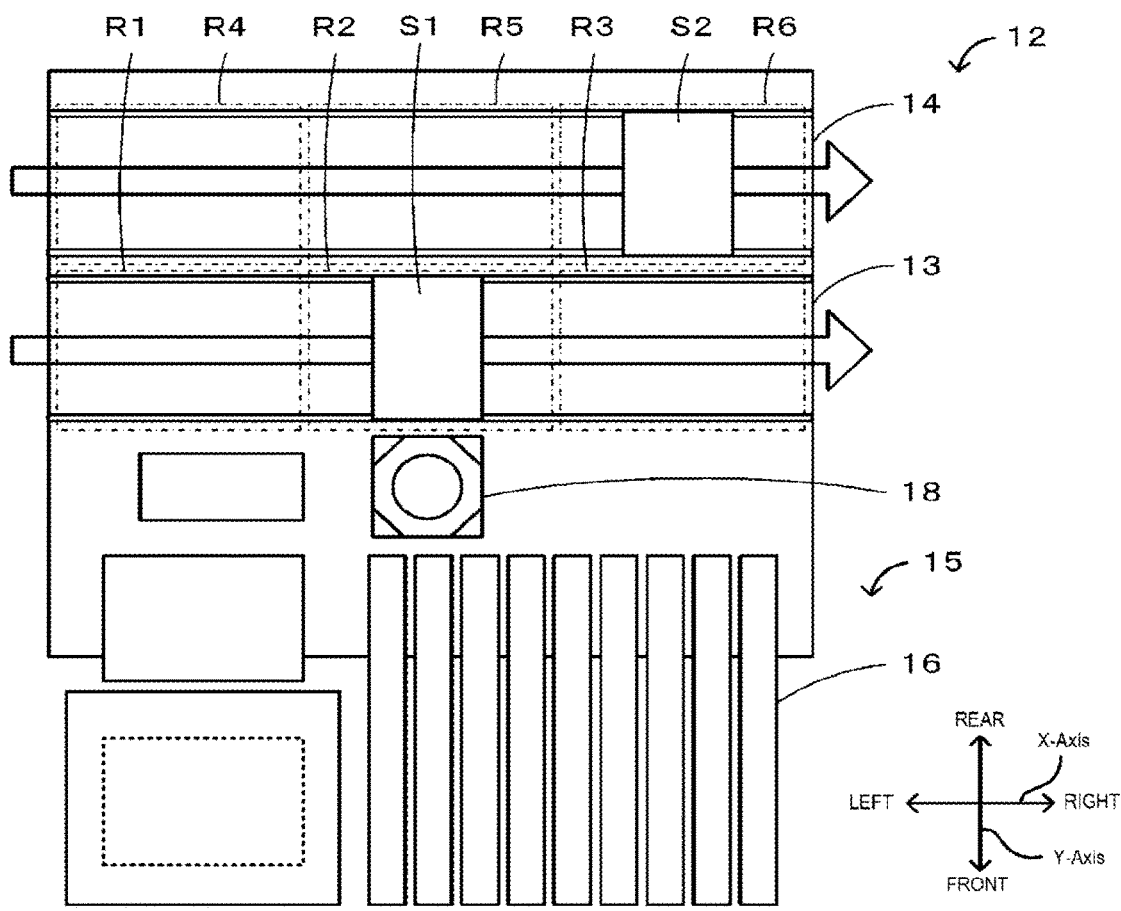
FIG. 2 is an explanatory view of board processing section 12.
Figure 3:
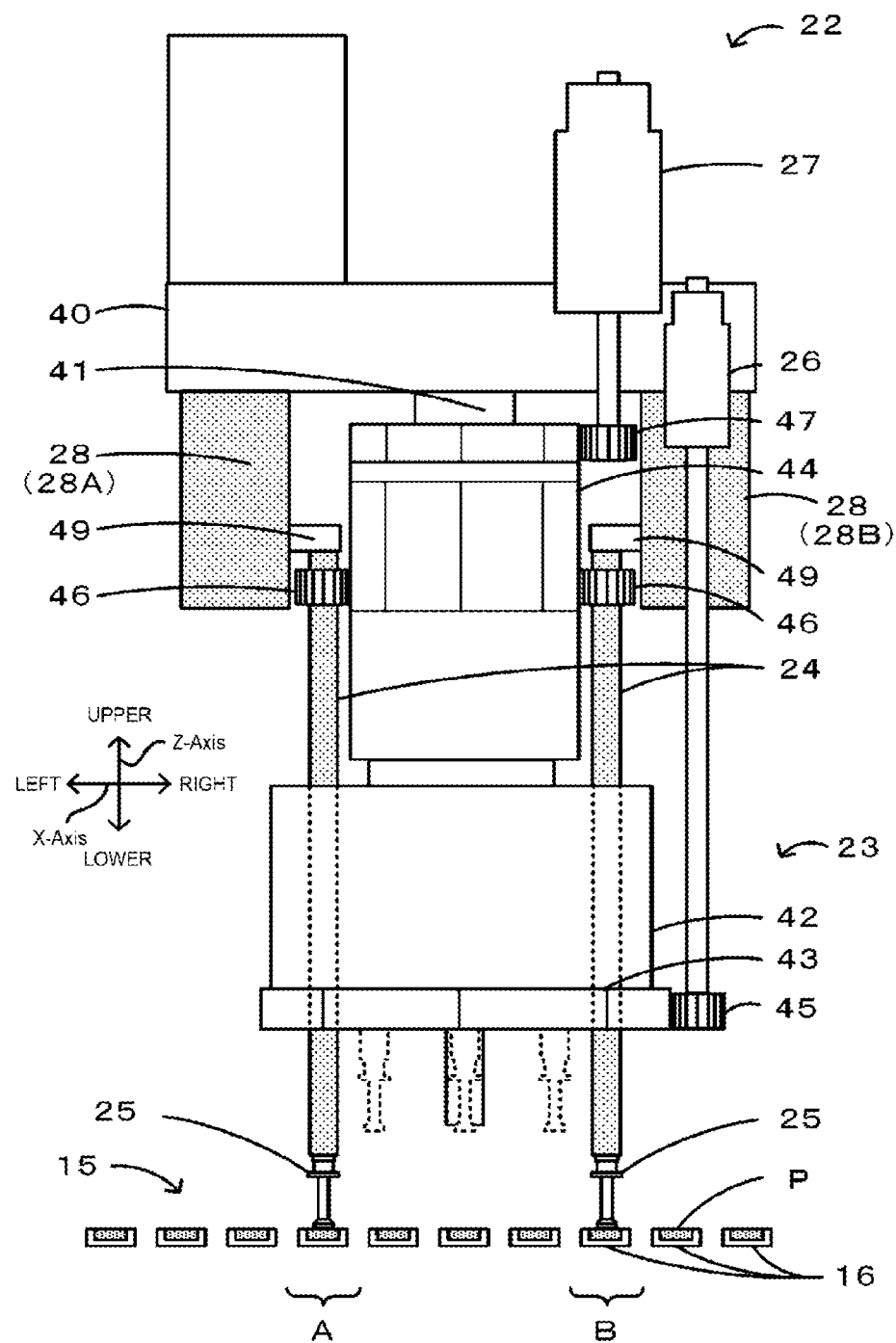
FIG. 3 is an explanatory view in which mounting head 22 picks up component P simultaneously.
Figure 4:
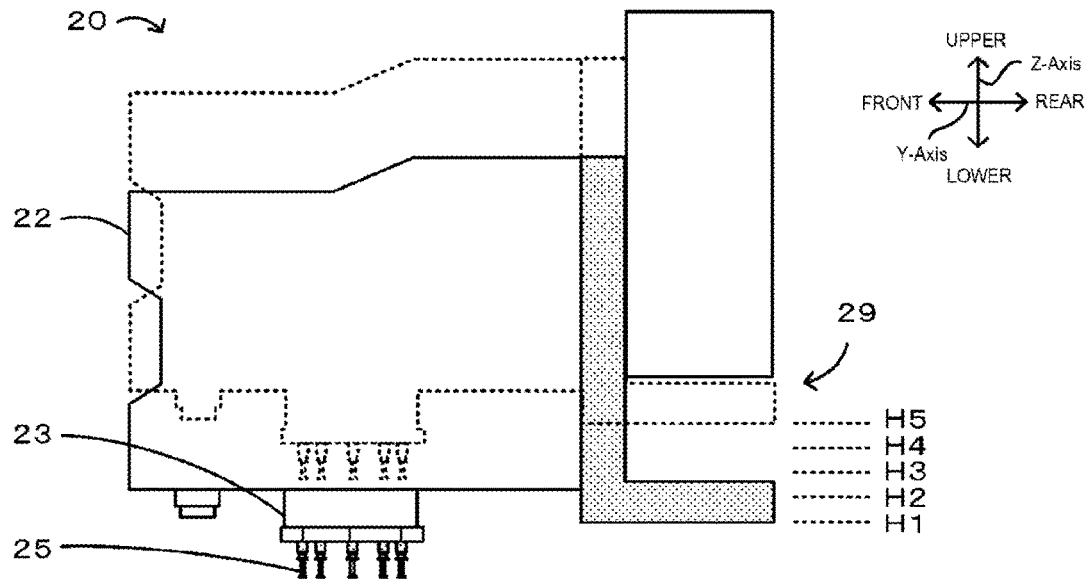
FIG. 4 is an explanatory view of head lifting and lowering section 29 of mounting head 22.
Figure 5:
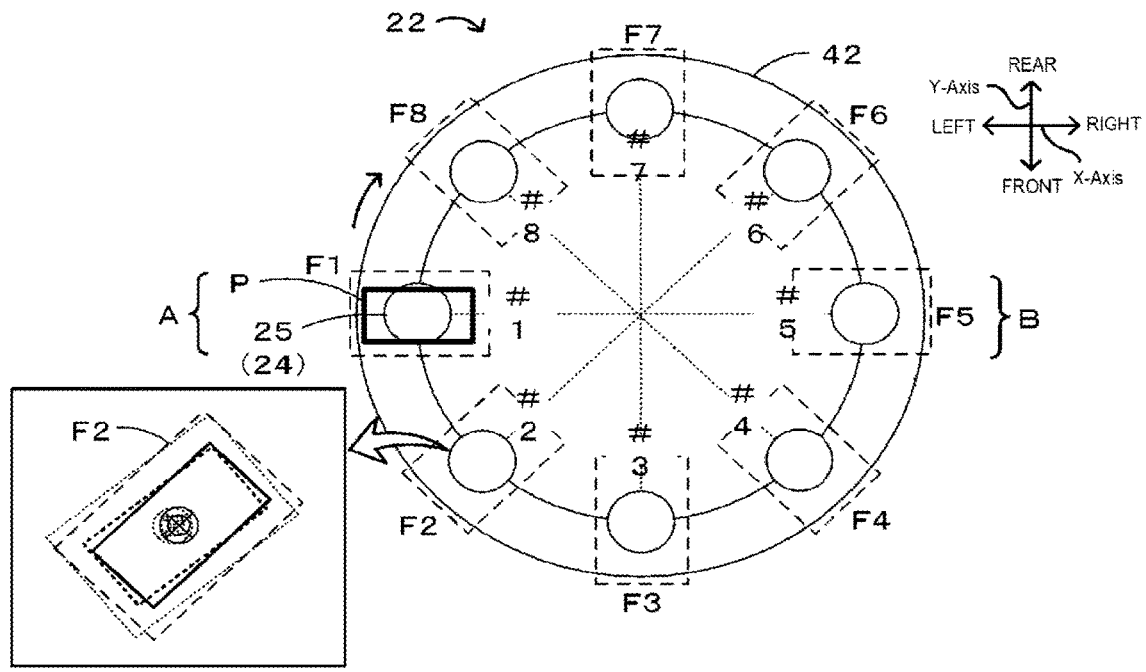
FIG. 5 is an explanatory view of mounting head 22 captured by component imaging section 18.
Figure 6:
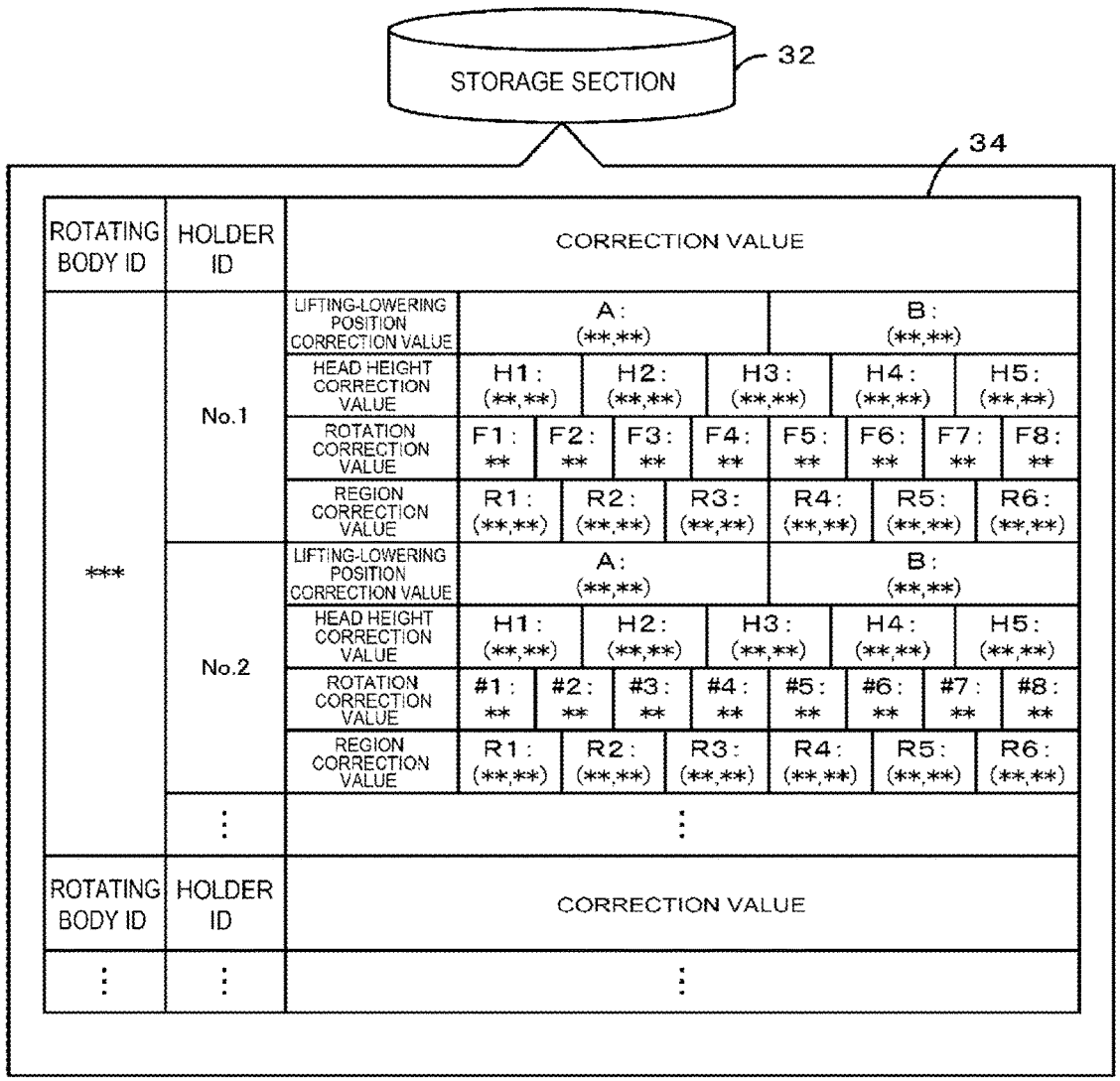
FIG. 6 is an explanatory view illustrating an example of correction information 34 stored in storage section 32.

The present embodiment will be described below with reference to the accompanying drawings. FIG. 1 is a schematic explanatory view illustrating an example of mounting system 10 according to the present disclosure. FIG. 2 is an explanatory view of board processing section 12. FIG. 3 is an explanatory view of head lifting and lowering section 29 of mounting head 22. FIG. 4 is an explanatory view in which mounting head 22 simultaneously picks up components P. FIG. 5 is an explanatory view of mounting head 22 captured by component imaging section 18. FIG. 6 is an explanatory view illustrating an example of correction information 34 stored in storage section 32. Mounting system 10 is, for example, a system configured to execute a mounting process of arranging component P on board S. Mounting system 10 includes mounting device 11 and management computer (PC) 50. Mounting system 10 is configured as a mounting line in which multiple mounting devices 11 are arranged from an upstream side to a downstream side. In FIG. 1, for convenience of description, only one mounting device 11 is illustrated. Management PC 50 is configured as a server configured to manage information of each device of mounting system 10. Management PC 50 creates mounting condition information including a mounting job used in the mounting process for component P, and transmits the created mounting condition information to the mounting device 11. In the present embodiment, the left-right direction (X-axis), the front-rear direction (Y-axis), and the vertical direction (Z-axis) are as illustrated in FIGS. 1 to 5.

As illustrated in FIG. 1, mounting device 11 includes board processing section 12, component supply section 15, component imaging section 18, mounting section 20, and control section 30.

Board processing section 12 is a section for conveying board S in, conveying board S, fixing board S at a mounting position, and conveying board S out. As illustrated in FIG.

2, board processing section 12 has a dual lane including first lane 13 for conveying board S by a first conveyor and second lane 14 for conveying board S by a second conveyor. First lane 13 and second lane 14 have a pair of conveyor belts which are provided by being opened in the front-rear direction at intervals and are stretched in the left-right direction. Board S is conveyed by these conveyor belts. In first lane 13, three regions R1 to R3 are set in order from an upstream side in a conveyance direction of board S, board S is fixed to one of the regions, and the mounting process is executed. Further, similarly, in second lane 14, three regions R4 to R6 are set in order from the upstream side in the conveyance direction of board S, board S is fixed to one of the regions, and the mounting process is executed. Board S conveyed on first lane 13 is referred to as board S1, and board S conveyed on second lane 14 is also referred to as board S2.

Component supply section 15 has multiple feeders 16 including reels and a tray unit, and is detachably attached to the front side of mounting device 11. A tape is wound around each reel, and multiple components P are held on the top surface of the tape along the longitudinal direction of the tape. The tape is unwound from the reel to the rear side, and is sent out, by feeder 16, to a pickup position where the tape is picked up by nozzle 25 in a state in which a component is exposed. The tray unit has a tray on which multiple components are arranged and placed, and moves this tray in and out of a predetermined pickup position.

Mounting section 20 picks up component P from component supply section 15 and disposes component P onto board S fixed to board processing section 12. Mounting section 20 includes head moving section 21, mounting head 22, rotating body 23, holder 24, and nozzle 25. Head moving section 21 includes a slider that is guided to a guide rail and moves in an XY direction and a motor configured to drive the slider. Mounting head 22 is detachably mounted on the slider and is moved in the XY direction by head moving section 21. One or more nozzles 25 are detachably mounted on the lower surface of mounting head 22 through rotating body 23. Multiple nozzles 25 of any one of multiple types are mounted on rotating body 23. Multiple (for example, 16, 8, 4 or the like) nozzles 25 are mounted on rotating body 23 through holder 24, so that multiple components P can be picked up at once. Holder 24 and nozzle 25 have uneven parts to be fitted therein, and nozzle 25 is mounted on holder 24 at a predetermined axial rotation position. Nozzle 25 is a pickup member configured to pick up a component using a negative pressure and is detachably mounted on mounting head 22 via holder 24. The pickup member may be a holding member configured to hold and pick up component P.

Mounting head 22 is configured as a rotary type work head which is held by rotating body 23 in a rotatable state. As illustrated in FIG. 3, rotating body 23 of mounting head 22 includes head main body 40 attached to an X-axis slider and engagement shaft 41 disposed below head main body 40. Rotating body 23 includes rotary section 42 that is a cylindrical member, R-axis gear 43 disposed below rotary section 42, Q-axis gear 44 disposed above rotary section 42, and long cylindrical multiple holders 24 each having nozzle 25 mounted on the lower end thereof. R-axis driving section 26 for pivoting rotary section 42, Q-axis driving section 27 for pivoting the nozzle 25, and Z-axis driving section 28 for elevating nozzle 25 by moving pressing section 49 are arranged in the head main body 40. A rotation axis of rotary section 42 is referred to as an R-axis, and a rotation axis of nozzle 25 is referred to as a Q-axis. Engagement shaft 41 is disposed in head main body 40 to be pivotally, is inserted into a bottomed hole formed in the center of Q-axis gear 44, and engages with rotating body 23. Rotary section 42 is, for example, a cylindrical member that supports multiple holders 24 to be rotatable about central axes of holders 24 or to be vertically movable. R-axis gear 43 is a disc-shaped member that has an outer diameter larger than that of rotary section 42, and has a gear groove formed on the outer peripheral surface thereof. R-axis gear 43 meshes with small gear 45 connected to a rotary shaft of R-axis driving section 26 and is rotationally driven by R-axis driving section 26 via small gear 45. Q-axis gear 44 is a cylindrical member having a smaller outer diameter than that of rotary section 42, and has a gear groove formed on the outer peripheral surface thereof. Holder 24 is a member that has small gear 46 disposed on the upper end side thereof and nozzle 25 mounted on the lower end side thereof. Small gear 46 meshes with the gear groove formed on the outer periphery of Q-axis gear 44. Holders 24 are disposed at regular intervals along the outer periphery of Q-axis gear 44. Holder 24 can adjust an angle of picked-up component P by rotating (rotating) about a rotary shaft (Q-axis) by a driving force of Q-axis driving section 27 transmitted through small gear 47 connected to Q-axis driving section 27, Q-axis gear 44, and small gear 46 disposed on the upper end side of holder 24. In mounting head 22, all holders 24 is synchronized and rotated in synchronization with the rotation of Q-axis gear 44. Holder 24 is elevated in a Z-axis direction (vertical direction) by a driving force of Z-axis driving section 28 transmitted via pressing section 49. In mounting head 22, first Z-axis driving section 28A elevates holder 24 in the Z-axis direction at first elevation position A located at a left end portion in an X-axis direction, and second Z-axis driving section 28B elevates holder 24 in the Z-axis direction at second elevation position B located at a right end portion. (see FIG. 3). When being fixed to the pickup position, mounting head 22 is configured to be able to pick up component P at the same time in two elevation positions.

Head lifting and lowering section 29 is disposed in mounting head 22. Head lifting and lowering section 29 includes a guide formed in the Z-axis direction and a driving section configured to move mounting head 22 along the guide, and elevates mounting head 22 in the Z-axis direction (see FIG. 4). For example, when component P having a low height is handled, mounting section 20 can lower mounting head 22 and shorten an elevation distance of nozzle 25 so as to further shorten a processing time. Further, when component P having a high height is handled, mounting section 20 can pick up mounting head 22 while further lifting up mounting head 22. In this way, mounting section 20 can continuously pick up components having different heights without replacing mounting head 22. As illustrated in FIG. 4, for example, head lifting and lowering section 29 is configured to be able to change the height of nozzle 25 between heights H1 to H5.

Component imaging section 18 (imaging section) is a device that captures an image, and is a unit that captures one or more components P picked up and held by mounting head 22. Component imaging section 18 is disposed between component supply section 15 and board processing section 12. An imaging range of component imaging section 18 is above component imaging section 18. When mounting head 22 holding component P passes through the upper side of component imaging section 18, component imaging section 18 captures an image, and outputs the captured image data to control section 30. As illustrated in FIG. 5, mounting section 20 includes nozzles 25 (holders 24) #1 to #8, and image ranges F1 to F8 are defined in which an image of component P is extracted from the captured image and image processing is performed on the image. In the conventional art, #1 nozzle 25 performs image processing while being disposed in image range F1. However, in this mounting head 22, it is set that #1 to #8 nozzles 25 perform the image processing regardless of where #1 to #8 nozzles 25 are arranged in image ranges F1 to F8. In this way, since it is not necessary to move specific nozzle 25 to a specific position, in the image processing, it is possible to shorten a time during which rotating body 23 is rotated.

As illustrated in FIG. 1, control section 30 is configured as a microprocessor centered on CPU 31 serving as a control section, and includes storage section 32 that stores various data. Control section 30 outputs a control signal to board processing section 12, component supply section 15, component imaging section 18, and mounting section 20, and receives input of signals from mounting section 20, component supply section 15, and component imaging section 18. Storage section 32 stores mounting condition information 33 and correction information 34. Mounting condition information 33 includes a mounting job such as a mounting order in which components P are mounted on board S and arrangement positions of components P. Mounting device 11 executes a mounting process based on mounting condition information 33. Correction information 34 is information including correction values used for correction of the pickup position and an arrangement position in the mounting process and correction of a range in which the image processing is performed. Correction information 34 includes at least a first correction value determined at a first position on the XYZ axis where mounting head 22 works and a second correction value determined at a second position different from the first position. In detail, correction information 34 includes identification information (ID) of rotating body 23, an elevation position correction value corresponding to the ID of holder 24, a head height correction value, a rotation correction value, a region correction value, and the like. The elevation position correction value includes a correction value for correcting the pickup position of the pickup member when holder 24 is in first elevation position A (see FIGS. 3 and 5) and a correction value for correcting the pickup position of the pickup member when holder 24 is in second elevation position B. Since deviation of the pickup position may change when the elevation position is changed, mounting device 11 defines the correction value associated with holder 24 for each elevation position. The head height correction value is a correction value for correcting the pickup position of the pickup member mounted on holder 24 when mounting head 22 is in any one of heights H1 to H5 (see FIG. 4). Since the deviation of the pickup position may change when the height of mounting head 22 is changed, mounting device 11 defines the correction value associated with holder 24 for each height of mounting head 22. The rotation correction value is a correction value for correcting the pickup position of the pickup member mounted on holder 24 when holder 24 is in any one of image ranges F1 to F8 (see FIG. 5). When the position of holder 24 is changed, deviation of the position or the angle of component P may change according to holder 24 due to an engagement relationship between gears. Therefore, mounting device 11 defines the correction value associated with holder 24 for each of the positions of image ranges F1 to F8 where holder 24 exists. The region correction value is a correction value for correcting the pickup position of the pickup member mounted on holder 24 when board S is in any one of regions R1 to R6 (see FIG. 2). Although mounting head 22 is moved in the XY direction by the slider, the guide rail is a beam and may be deflected slightly at the center portion. Therefore, the amount and the direction of the deviation of the pickup member may change depending on which region in the XY direction mounting head 22 works. Therefore, the mounting device 11 defines the correction value associated with holder 24 for each region where the board S is fixed. In FIG. 6, for convenience of description, the correction values of correction information 34 are represented in a table format. However, correction information 34 may include a correction value in a map format in which the elevation position, the head height, the rotation position, and the region in the XY directions are associated with each other. Mounting device 11 performs advanced position correction using correction information 34, and executes the mounting process.

Next, a process of setting correction information 34 in an operation of mounting system 10 of the present embodiment configured as described above will be firstly described. The process of setting correction information 34 may be performed manually or may be performed automatically by control section 30. For example, in setting of the elevation position correction value, in a state in which holder 24 for setting the correction value is disposed in first elevation position A, holder 24 is lowered, and the amount of the deviation of the center position of nozzle 25 is measured. Then, the correction value for offsetting the amount of the deviation is set, and is stored in correction information 34 in which holder 24, first elevation position A, and the correction value are associated with each other. By performing this process for all holders 24 at all the elevation positions, the elevation position correction value can be set. Correction information 34 can be set by executing this process for all the head height correction value, the rotation correction value, and the region correction value. Each correction value is set such that proper position correction can be executed by combining other correction values. The setting of correction information 34 may be performed periodically after a predetermined period has elapsed.

Figure 7:
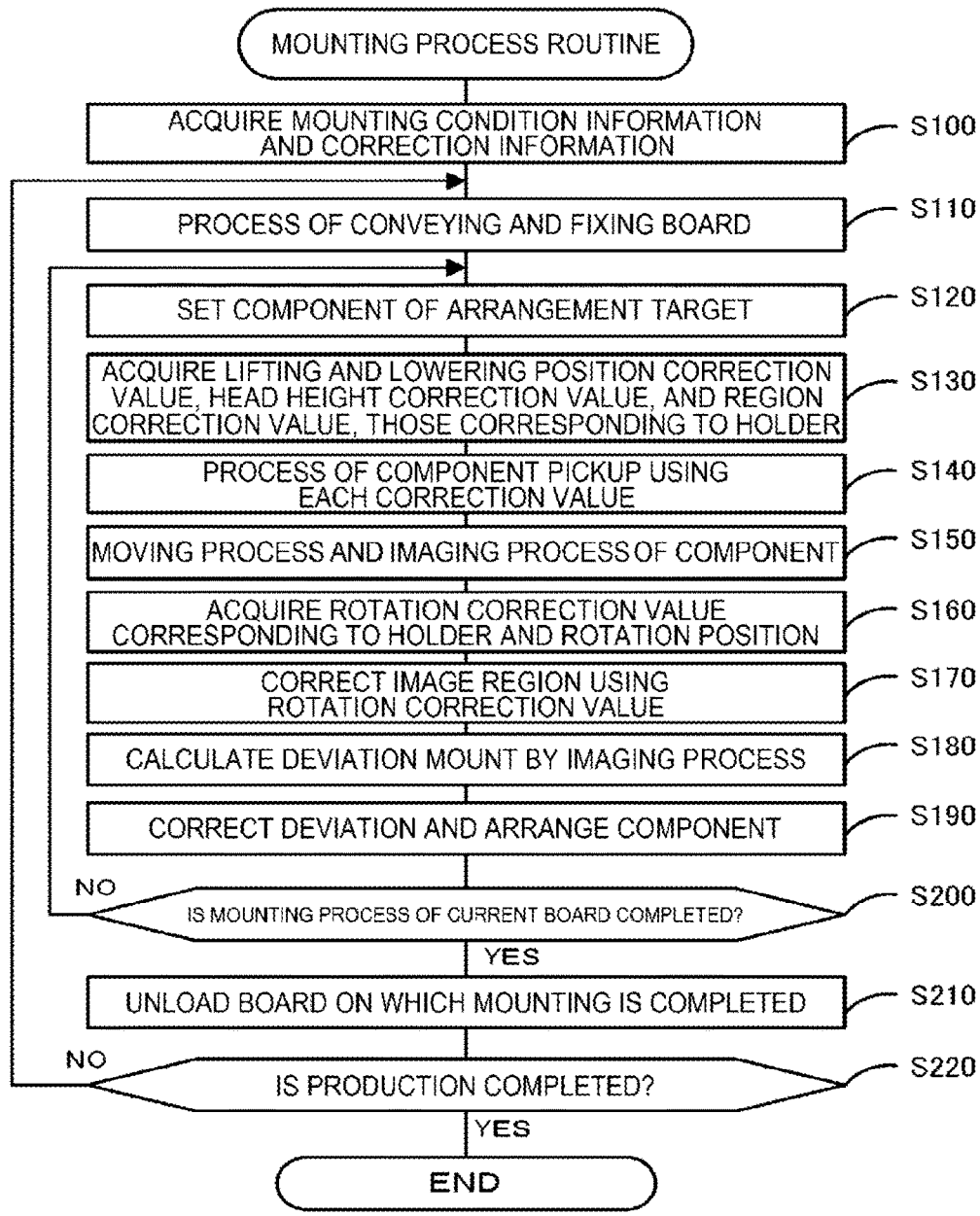
FIG. 7 is a flowchart illustrating an example of a mounting process routine.

Next, the operation of mounting system 10, particularly, the mounting process in mounting device 11 will be described. FIG. 7 is a flowchart illustrating an example of a mounting process routine executed by CPU 31 of control section 30. This routine is stored in storage section 32 and is executed based on a mounting start input of an operator. When this routine is started, CPU 31 first reads out and acquires mounting condition information 33 and the correction information 34 (S100) and causes board processing section 12 to convey and fix board S (S110). Next, CPU 31 sets component P that is an arrangement target picked up by nozzle 25 based on an arrangement order of mounting condition information 33 (S120). Next, CPU 31 acquires the elevation position correction value, the head height correction value, and the region correction value corresponding to holder 24 on which nozzle 25 is mounted (S130). CPU 31 acquires, as a state of holder 24, each correction value according to the elevation position, the height of mounting head 22, the region where board S is fixed, and the like.

Next, CPU 31 executes a process of picking up component P while correcting the pickup position of the pickup member (nozzle 25) mounted on holder 24 using the acquired elevation position correction value, the acquired head height correction value, and the acquired region correction value (S140). In the pickup process, CPU 31 replaces or mounts nozzle 25 as needed, moves mounting head 22 to the pickup position of component supply section 15, and lowers nozzle 25 at first elevation position A and/or the second elevation position B to pick up component P. At this time, the correction value is used so that, component P can be picked up with extremely high positional accuracy. After picking up component P to nozzle 25 mounted on rotating body 23, CPU 31 executes a moving process of causing mounting head 22 to pass over component imaging section 18 and an imaging process of component imaging section 18 to capture an image of mounting head 22 (S150).

Next, CPU 31 acquires, from correction information 34, the rotation correction value corresponding to holder 24 and the rotation position of holder 24 (S160). Next, CPU31 corrects the position and the angle of an image region to be image-processed using the acquired rotation correction value (S170), and processes an image of the corrected image region to calculate the amount of the deviation from an ideal position (S180). In mounting device 11, the image processing is performed on the image region corrected using the rotation correction value, so that the image region to be image-processed can be made smaller, and the processing time can be further shortened. Then, CPU 31 executes a process of correcting the calculated amount of the deviation and arranging component P (S190).

CPU 31 determines whether the mounting process of a current board is completed (S200), and executes the process after S120 when the mounting process is not completed. That is, CPU 31 sets component P to be picked up next, replaces nozzle 25 as needed, and corrects the amount of the deviation using the correction value, so as to execute the pickup process of component P, the imaging process of the image, and an arrangement process to board S. On the other hand, when the mounting process of the current board is completed in S200, CPU 31 causes board processing section 12 to unload board S on which the mounting process is completed (S210), and determines whether production is completed (S220). CPU 31 executes the process after S110 when the production is not completed, and terminates the routine as it is when the production is completed.

Here, a correspondence relationship between the components of the present embodiment and the components of the present disclosure will be clarified. Mounting head 22 of the present embodiment corresponds to the mounting head of the present disclosure, holder 24 and nozzle 25 correspond to the pickup section, storage section 32 corresponds to the storage section, and control section 30 corresponds to the control section. Further, head lifting and lowering section 29 corresponds to an elevation mechanism, component imaging section 18 corresponds to an imaging section, rotating body 23 corresponds to a rotating body, board processing section 12 corresponds to a conveyance section, first lane 13 corresponds to a first lane, and second lane 14 corresponds to a second lane. In the present embodiment, an example of a mounting method of the present disclosure is clarified by describing the operation of control section 30.

In above-described mounting device 11 of the present embodiment, a correction value for position correction of component P is set for each of different positions where mounting head 22 works, and the mounting process is performed using an appropriate correction value for each of the positions. In mounting device 11, by using multiple correction values, the mounting accuracy can be further enhanced. Further, mounting head 22 stores a first elevation correction value as a first correction value corresponding to a combination of first elevation position A and holder 24 and a second elevation correction value as a second correction value corresponding to a combination of second elevation position B and holder 24. Mounting device 11 has multiple elevation positions of holder 24 and the correction values associated with holders 24 are provided for the elevation positions, so that the mounting accuracy can be further improved by using multiple correction values according to the elevation positions.

Further, mounting device 11 can change the height of mounting head 22 in multiple stages (H1 to H5), and the correction values associated with holders 24 are provided for the heights, so that the mounting accuracy can be further improved by using the multiple correction values according to the heights of mounting head 22. Further, mounting device 11 can rotate multiple holders 24, holders 24 have multiple rotation positions F1 to F8, and the correction values associated with holders 24 are provided for the rotation positions, so that the mounting accuracy can be further improved by using the multiple correction values according to the rotation position. Furthermore, mounting device 11 can fix board S to multiple regions R1 to R6, and the correction values associated with holders 24 are provided for the fixing regions, so that the mounting accuracy can be further improved by using the multiple correction values according to the fixing position (work region of mounting head 22) of board S.

Further, board processing section 12 has regions R1 to R3 or regions R4 to R6 in the conveyance direction of the board, and the correction values are provided for the multiple regions, so that the mounting accuracy can be further improved according to the fixing position along the conveyance direction of the board. Further, board processing section 12 has first lane 13 and second lane 14 for conveying board S, and the correction values are provided for the lanes, so that the mounting accuracy can be further improved by using multiple correction values according to the conveyance lanes. In mounting device 11, for example, various factors, which degrade the mounting accuracy, such as a mechanical assembly error due to the Z-axis, a mechanical assembly error due to a base of head lifting and lowering section 29, a mechanical assembly error of a conveyor of board processing section 12, and a mechanical assembly error due to the XY directions of mounting head 22, can be eliminated, so that the mounting process can be executed more accurately.

It is obvious that the control device and the mounting device of the present disclosure are not limited to the above-described embodiments, and can be implemented in various modes as long as the modes belong to the technical scope of the present disclosure.

For example, in the above-described embodiments, it has been described that the elevation position correction value, the head height correction value, the rotation correction value, and the region correction value are used. However, the present disclosure is not particularly limited thereto, and one or more of the correction values may be omitted or a correction value other than these correction values may be used in a combination. Further, although mounting head 22 has the two elevation positions, the number of the elevation positions may be one or more, and the correction values may be adjusted accordingly. Further, although mounting head 22 has the five head heights, the number of the head heights may be one or more and the correction values may be adjusted accordingly. Further, although mounting head 22 has eight holders 24, the number of holders 24 may be one or more, and the rotation correction value may be adjusted accordingly. Further, in board processing section 12, although board S is fixed to one of six locations obtained by multiplying the number of the 2 lanes and the number of 3 locations in the conveyance direction, the number of the lanes may be one or more, the number of the locations in the conveyance direction may be one or more, and the correction values may be adjusted accordingly. It is preferable that the number of types of the correction values is larger in order to improve the mounting accuracy.

In the above-described embodiment, although examples of the correction values are illustrated in FIG. 6, in the case of a comprehensive correction value such as a manual offset, correction values of all combinations (or some combinations) may be provided.

Although the present disclosure has been described as mounting device 11 in the above-described embodiment, the present disclosure may be a mounting method or a program that executes this mounting method.

Here, the mounting device and the mounting method of the present disclosure may be configured as follows. In the mounting device according to the present disclosure, the mounting head may have a first elevation position as the first position where the pickup section is elevated on a Z-axis and a second elevation position as the second position where the pickup section is elevated at a position different from the first elevation position, and the storage section may store a first elevation correction value corresponding to a combination of the first elevation position and the pickup section and serving as the first correction value for position correction of the component and a second elevation correction value corresponding to a combination of the second elevation position and the pickup section and serving as the second correction value for position correction of the component. The mounting device has the elevation positions of the multiple pickup sections, and the correction value associated with the pickup section is provided for each of the elevation positions, so that the mounting accuracy can be further improved by using the multiple correction values according to the elevation positions.

In the mounting device according to the present disclosure, the mounting head may be disposed in an elevation mechanism that holds the mounting head at a first height as the first position and a second height as the second position different from the first height, and the storage section may store a first position correction value corresponding to a combination of the first height and the pickup section and serving as the first correction value for position correction of the component and a second position correction value corresponding to a combination of the second height and the pickup section and serving as the second correction value for position correction of the component. The mounting device can change the height of the mounting head to multiple values, and the correction value associated with the pickup section is provided for each height, so that the mounting accuracy can be further improved by using the multiple correction values according to the heights of the mounting head.

The mounting device of the present disclosure may further includes an imaging section configured to capture an image of the mounting head, in which the mounting head may have a rotating body configured to rotate the pickup section at a first rotation position as the first position where the multiple pickup sections are arranged on a circumference and are pivotally supported and a second rotation position as the second position different from the first rotation position, the storage section may store a first rotation correction value corresponding to a combination of the first rotation position and the pickup section and serving as the first correction value for position correction of the component and a second rotation correction value corresponding to a combination of the second rotation position and the pickup section and serving as the second correction value for position correction of the component, and the control section may execute the mounting process of performing correction of a selection region of the captured image captured by the imaging section and/or correction of a position of the rotating body of the mounting head using the first rotation correction value and/or the second rotation correction value stored in the storage section. This mounting device can rotate the multiple pickup sections, the pickup sections have the multiple rotation positions, and the correction value associated with the pickup section is provided for each rotation position, so that the mounting accuracy can be further improved by using the multiple correction values according to the rotation positions. Here, the "first rotation correction value" and the "second rotation correction value" may be a correction value of the rotation angle of the component.

The mounting device of the present disclosure may further include a conveyance section configured to convey the board and fix the board to a first region as the first position on the XY axes and a second region as the second position different from the first region, in which the storage section may store a first region correction value corresponding to a combination of the first region and the pickup section and serving as the first correction value for position correction of the component and a second region correction value corresponding to a combination of the second region and the pickup section and serving as the second correction value for position correction of the component, and the control section may execute the mounting process of performing correction of a position of the board fixed by the conveyance section and/or correction of a position of the mounting head using the first region correction value and/or the second region correction value stored in the storage section. The mounting device can fix the board at multiple regions, and the correction value associated with the pickup section is provided for each fixing region, so that the mounting accuracy can be further improved by using the multiple correction values according to the fixing positions of the board.

In the mounting device of the present disclosure having the first region and the second region, the conveyance section may have the first region and the second region in the conveyance direction of the board. In the mounting device, the correction value is provided for each of the multiple regions along the conveyance direction of the board, so that the mounting accuracy can be further improved according to the fixing position along the conveyance direction of the board. Alternatively, in the mounting device of the present disclosure, the conveyance section may include a first lane for conveying the board and a second lane juxtaposed to the first lane, the first lane may include the first region, and the second lane may include the second region. In this mounting device, the correction value is provided for each lane for conveying the board, so that the mounting accuracy can be further improved by using the multiple correction values according to the conveyance lanes.

A mounting method for executing a mounting process of mounting a component on a board using a mounting head including at least one pickup section for picking up the component and configured to move the picked up component according to the present disclosure includes executing the mounting process using at least one of a first correction value determined at a first position on the XYZ axes where the mounting head works and a second correction value determined at a second position different from the first position.

In this mounting method, similarly to the above-described mounting device, the correction value is determined for each different position where the mounting head works, and mounting process is performed using the correction value suitable for each position. In this mounting device, the mounting accuracy can be further improved using multiple correction values. In this mounting method, various aspects of the above-described mounting device may be adopted or a configuration for realizing each function of the above-described mounting device may be added.

INDUSTRIAL APPLICABILITY

The present disclosure can be used in a technical field of a device configured to perform a mounting process of picking up and arranging a component.

REFERENCE SIGNS LIST

10 Mounting System, 11 Mounting Device, 12 Board Processing Section, 13 First Lane, 14 Second Lane, 15 Component Supply Section, 16 Feeder, 18 Component Imaging Section, 20 Mounting Section, 21 Head Movement Section, 22 Mounting Head, 23 Rotating body, 24 Holder, 25 Nozzle, 26 R-Axis Driving Section, 27 Q-Axis Driving Section, 28 Z-Axis Driving Section, 28A First Z-Axis Driving Section, 28B Second Z-Axis Driving Section 28, 30 Control Section, 31 CPU, 32 Storage Section, 33 Mounting Condition Information, 34 Correction Information, 40 Head Main Body, 41 Engagement Shaft, 42 Rotary Section, 43 R-Axis Gear, 44 Q-Axis Gear, 45 to 47 Small Gears, 49 Pressing Section, 50 Management PC, A First Elevation Position, B Second Elevation Position, F1 to F8 Image Ranges, H1 to H5 Heights, R1 to R6 Region, P Component, S board

The invention claimed is:

1. A mounting device for executing a mounting process of mounting a component on a board, the mounting device comprising:
   a mounting head that includes at least one pickup section for picking up the component and moves the picked up component;
   a storage section which stores at least a first correction value, being determined at a first position on XYZ axes on which the mounting head works, and a second correction value determined at a second position different from the first position; and
   a control section configured to execute the mounting process by using at least one of the first correction value and the second correction value stored in the storage section,
   wherein the mounting head has a first elevation position as the first position where the pickup section is elevated on a Z-axis and a second elevation position as the second position where the pickup section is elevated at a position different from the first elevation position, and
   wherein the storage section stores a first elevation correction value corresponding to a combination of the first elevation position and the pickup section and serving as the first correction value for position correction of the component and a second elevation correction value corresponding to a combination of the second elevation position and the pickup section and serving as the second correction value for position correction of the component.

2. The mounting device according to claim 1,
   wherein the mounting head is disposed in an elevation mechanism that holds the mounting head at a first height as the first position and a second height as the second position different from the first height, and
   wherein the storage section stores a first position correction value corresponding to a combination of the first height and the pickup section and serving as the first correction value for position correction of the component and a second position correction value corresponding to a combination of the second height and the pickup section and serving as the second correction value for position correction of the component.

3. The mounting device according to claim 1, further comprising
   an imaging section configured to capture an image of the mounting head, wherein
   the mounting head has a rotating body configured to rotate the pickup section between a first rotation position as the first position where the multiple pickup sections are arranged on a circumference and are pivotally supported and a second rotation position as the second position different from the first rotation position,
   the storage section stores a first rotation correction value corresponding to a combination of the first rotation position and the pickup section and serving as the first correction value for position correction of the component and a second rotation correction value corresponding to a combination of the second rotation position and the pickup section and serving as the second correction value for position correction of the component, and
   the control section executes the mounting process by performing correction of a selection region of a captured image captured by the imaging section and/or correction of a position of the rotating body of the mounting head using the first rotation correction value and/or the second rotation correction value stored in the storage section.

4. A mounting device for executing a mounting process of mounting a component on a board, the mounting device comprising:
   a mounting head that includes at least one pickup section for picking up the component and moves the picked up component
   a storage section which stores at least a first correction value, being determined at a first position on XYZ axes on which the mounting head works, and a second correction value determined at a second position different from the first position;
   a control section configured to execute the mounting process by using the first correction value and/or the second correction value stored in the storage section; and
   a conveyance section configured to convey the board and fix the board to a first region as the first position on XY axes and a second region as the second position different from the first region,
   wherein the storage section stores a first region correction value corresponding to a combination of the first region and the pickup section and serving as the first correction value for position correction of the component and a second region correction value corresponding to a combination of the second region and the pickup section and serving as the second correction value for position correction of the component, and
   wherein the control section executes the mounting process by performing correction of a position of the board fixed by the conveyance section and/or correction of a position of the mounting head using the first region correction value and/or the second region correction value stored in the storage section.

5. The mounting device according to claim 4, wherein the conveyance section has the first region and the second region in a conveyance direction of the board.

6. The mounting device according to claim 4, wherein the conveyance section has a first lane configured to convey the board and a second lane juxtaposed to the first lane, the first lane has the first region, and the second lane has the second region.

7. A mounting method for executing a mounting process of mounting a component on a board using a mounting head including at least one pickup section for picking up the component and configured to move the picked up component, the mounting method comprising:

executing the mounting process using at least one of a first correction value determined at a first position on XYZ axes where the mounting head works and a second correction value determined at a second position different from the first position, wherein the mounting head has a first elevation position as the first position where the pickup section is elevated on a Z-axis and a second elevation position as the second position where the pickup section is elevated at a position different from the first elevation position; and storing in a storage section at least the first correction value, the second correction value, a first elevation correction value corresponding to a combination of the first elevation position and the pickup section and serving as the first correction value for position correction of the component, and a second elevation correction value corresponding to a combination of the second elevation position and the pickup section and serving as the second correction value for position correction of the component.

* * * * *